United States Patent [19]

Molinari et al.

[11] 4,249,256

[45] Feb. 3, 1981

[54] CONTINUOUS TUNING ARRANGEMENT FOR A MULTIBAND TELEVISION RECEIVER

[75] Inventors: Thomas E. Molinari, Indianapolis, Ind.; Dal F. Griepentrog, Taipei, Taiwan

[73] Assignee: RCA Corporation, New York, N.Y.

[21] Appl. No.: 965,201

[22] Filed: Nov. 30, 1978

[51] Int. Cl.³ .............................................. H04B 1/06
[52] U.S. Cl. .................................. 455/180; 455/176; 331/177 R; 334/15; 358/191.1
[58] Field of Search ............... 325/452, 453, 458, 459, 325/464, 465, 468; 334/11, 15, 14; 331/177 R, 177 V; 358/191, 193.1; 455/170, 175, 176, 177, 150, 180, 179, 187, 188

[56] References Cited

U.S. PATENT DOCUMENTS

| | | | |
|---|---|---|---|
| 3,492,514 | 1/1970 | Korn | 334/15 |
| 3,526,859 | 9/1970 | Putler | 334/15 |
| 3,646,450 | 2/1972 | MA | 325/465 |
| 3,715,495 | 2/1973 | Takezaki | 358/193.1 |
| 3,750,030 | 7/1973 | Worcester | 325/468 |
| 3,878,466 | 4/1975 | Hendrickson | 325/464 |
| 3,906,373 | 9/1975 | Hendrickson | 325/464 |
| 3,962,643 | 6/1976 | MA | 325/459 |

FOREIGN PATENT DOCUMENTS 1027405  4/1966  United Kingdom ..................... 455/180

OTHER PUBLICATIONS

A T.V. Tuning Method with Automatic Band Switching, by Hashima, Transactions on Joint Conference of West Japanese Branches of Electrical and Electronic Engineering on Oct. 20, 1978.

*Primary Examiner*—Robert L. Griffin
*Assistant Examiner*—Tommy P. Chin

[57] ABSTRACT

A television tuning system for generating a tuning voltage for a varactor controlled local oscillator includes a continuous resistive element having first, second, third and fourth points along its resistive path which define first, second and third resistive sections corresponding, respectively, to the low VHF, high VHF and UHF tuning bands and a movable contact. A position detecting arrangement determines the position of the movable contact along the path of the resistive element to determine which band is being tuned and in response selectively couples voltages corresponding to the magnitudes of the tuning voltage corresponding to the beginning and end points of the various bands to respective points along the resistive element. As a result, with continuous motion of the movable contact a tuning voltage for each channel in the television range is developed at the movable contact.

8 Claims, 6 Drawing Figures

CONTINUOUS TUNING ARRANGEMENT FOR A MULTIBAND TELEVISION RECEIVER

BACKGROUND OF THE PRESENT INVENTION

The present invention pertains to the field of tuners with voltage variable frequency determining elements.

Electronic tuners for television receivers conventionally comprise a tuned circuit including a varactor diode reverse biased to exhibit a capacitive characteristic and an inductor for each of the television bands. For example, in the United States, television receivers include tuned circuits including a varactor diode and an inductor for a low VHF band including channels 2 through 6, a high VHF band including channels 7 through 13 and a UHF band including channels 14 through 83. The tuned circuits are selectively enabled by bandswitching signals representative of the band in which a selected channel resides. The capacitance reactance of the varactor diode and thereby the frequency to which the tuned circuits are tuned is determined by the magnitude of a tuning voltage.

Many systems for deriving the tuning voltage are known. One of the simplest and therefore most economical types of these systems includes a potentiometer coupled between two points of potential. The tuning voltage is derived at a movable contact or wiper arm of the potentiometer and therefore is continuously variable. This permits a single tuning control for both coarse and fine tuning. In addition, such systems are rapidly tunable compared to so-called mechanical detent tuners.

Unfortunately, in general, the bands of tuning voltage corresponding to the three bands of the television tuning range are not consecutive but rather overlap each other. That is, the magnitudes of tuning voltage corresponding to the lowest frequency channels in the high VHF and UHF bands are lower than the magnitudes of tuning voltage corresponding to the highest frequency channels in the respective one of the preceding bands. Therefore, television tuning systems of this type in which a tuning voltage is generated at the movable contact of a potentiometer have typically not been able to continuously and consecutively tune a television receiver thorughout the television tuning range.

SUMMARY OF THE PRESENT INVENTION

According to one feature of the present invention, a tuning system for continuously and consecutively tuning a receiver to various channels in at least a first and a second tuning band includes a frequency tunable circuit, voltage variable means for determining the frequency response of said frequency tunable circuit, a continuous resistive section having first, second and third points defining first and second sections corresponding to first and second bands, a movable contact and a means for moving the movable contact along the first and second sections. A voltage switching means selectively couples different voltages to the resistive element in response to the position of the movable contact along the resistive element so that as the movable contact is continuously and consecutively moved along the resistive element, a tuning voltage for tuning all of the various channels is generated at the movable contact.

According to another feature of the present invention, in a tuning system in which a tuning voltage is generated at a movable contact of a potentiometer, comparator means generates a control signal in response to the relationship of the tuning voltage and the voltage developed at a point along the resistive element of the potentiometer. The control signal is indicative of the position of the movable contact and thereby the channel presently being tuned. Therefore, the control signal may be used, for example, as indicated above or as a bandswitching signal for selecting the operating band of a voltage controlled oscillator.

BRIEF DESCRIPTION OF THE DRAWING

In the various FIGURES, those portions corresponding to the same or similar portions are identified by the same reference numbers.

DETAILED DESCRIPTION OF THE DRAWING

Figure 1:
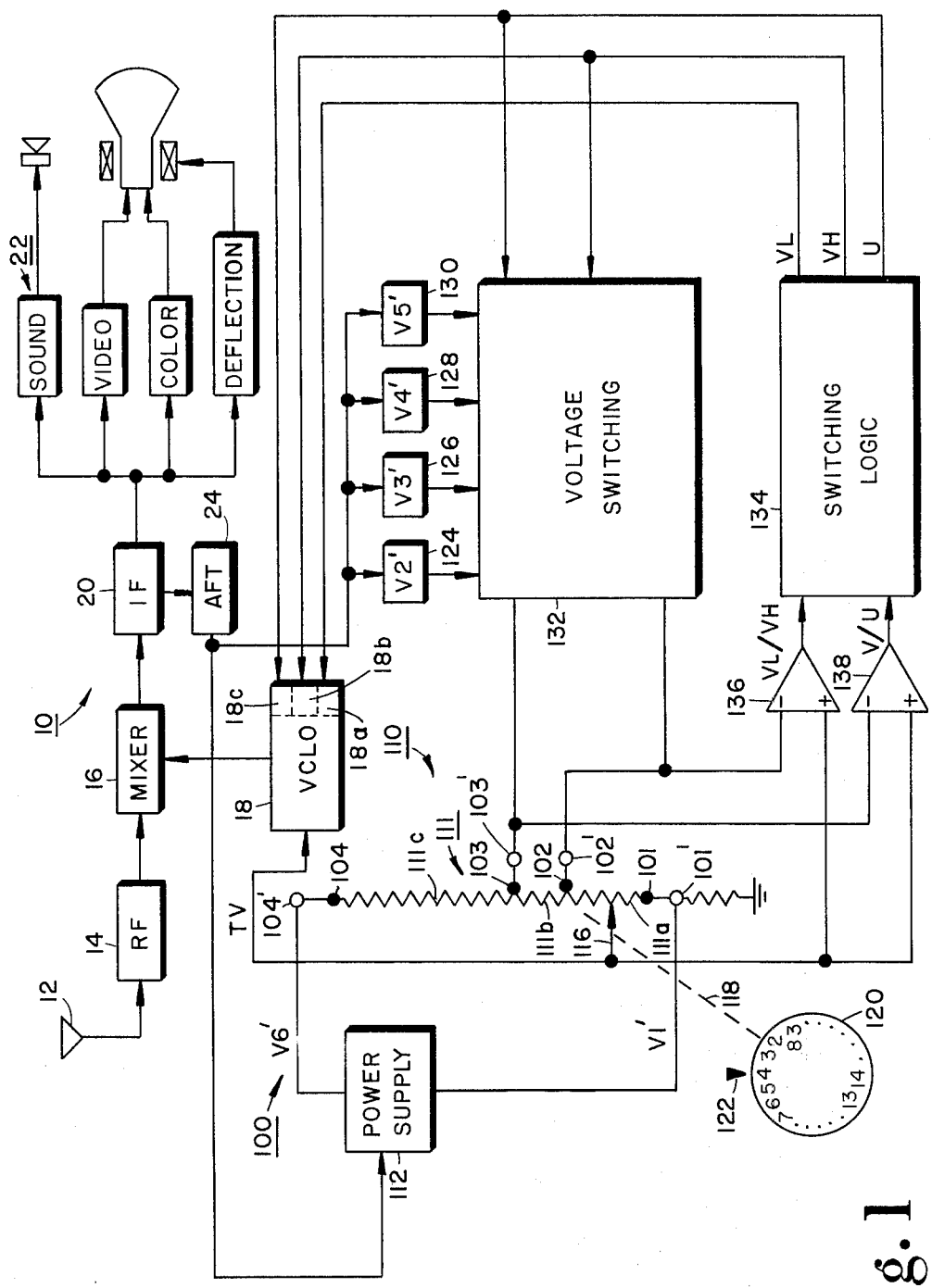
FIG. 1 shows in block diagram form a television receiver employing a tuning system constructed in accordance with the present invention.

In FIG. 1, a television receiver 10 includes an antenna 12 which couples RF signals to an RF signal processing unit 14. RF signal processing unit 14 filters and amplifies the RF signals. A mixer 16 combines the processed RF signals with a local oscillator signal generated by a voltage controlled local oscillator (VCLO) 18 to produce an IF signal. The IF signal is amplified and filtered by an IF signal processing unit 20. The processed IF signal contains components bearing video, color, deflection and sound information. The various components of the processed IF signal are coupled to respective sections of picture and audio portion 22 of receiver 10.

Voltage controlled local oscillator 18 comprises a tuning arrangement including a varactor diode and an inductor for each of the television tuning bands to which receiver 10 may be tuned. In the United States, the television tuning range is partitioned into a low VHF band for channels 2 through 6, a high VHF band for channels 7 through 13 and a UHF band for channels 14 through 83. In receiver 10 arranged, by way of example, for NTSC standards utilized in the United States, bandswitching signals VL (for the low VHF band), VH (for the high VHF band) and U (for the UHF band) selectively enable respective tuning arrangements 18a, 18b and 18c of VCLO 18 to determine the frequency band in which it oscillates. The magnitude of a tuning voltage (TV) determines the specific frequency at which VCLO 18 oscillates. Although the various tuning arrangements are selectively enabled by different bandswitching signals, the same tuning voltage is coupled to each of the arrangements. As is typical, the tuning voltage and bandswitching signals are also coupled to varactor tuning arrangements in RF unit 14 corresponding to those of VCLO 18 so that amplitude versus frequency response of RF unit 14 will track the tuning of VCLO 18. These connections have been omitted from FIG. 1 for the sake of simplicity.

RF unit 14, mixer 16 and VCLO 18 may comprise the combination of a KRK-228 VHF varactor diode tuner and a KRK-226 UHF varactor diode tuner as disclosed in "RCA Television Service Data-Chassis CTC-74 Series", File 1977, C-9, published by RCA Corporation, Indianapolis, Ind., hereby incorporated by reference.

Figure 2:
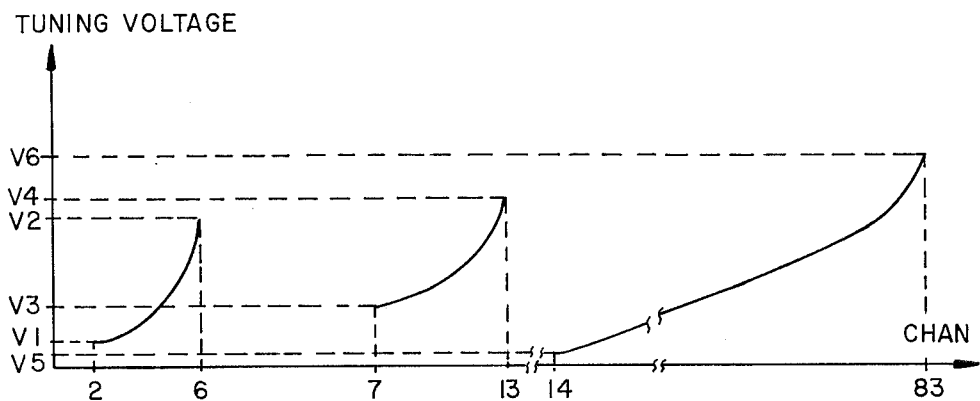
FIG. 2 shows graphical representations of tuning voltage versus channel characteristics of varactor diode tuning arrangements useful in facilitating an understanding of the tuning system shown in FIG. 1.

Typical tuning voltage versus channel frequency characteristics for a varactor oscillator of the type which may be employed as VCLO 18 are shown in FIG. 2. The tuning characteristics for the three bands are separate. The magnitudes for the beginning and end points of the three bands are as indicated: V1 corresponds to the lowest frequency channel in the low VHF band; V2 corresponds to the highest frequency channel in the low VHF band; V3 corresponds to the lowest frequency channel in the high VHF band; V4 corresponds to the highest frequency channel in the high VHF band; V5 corresponds to the lowest frequency channel in the UHF band; and V6 corresponds to the highest frequency channel in the UHF band. The three bands have tuning voltage regions which overlap each other. Thus, although the frequency of channel 7 is higher than the frequency of channel 6, the magnitude of tuning voltage V3 for channel 7 is lower than the magnitude of tuning voltage V2 for channel 6. Similarly, although the frequency of channel 14 is higher than the frequency of channel 13, the magnitude of tuning voltage V5 for channel 14 is lower than the magnitude of tuning voltage V4 for channel 13. As a result, television tuning systems including a potentiometer in which a tuning voltage is generated at the movable contact of the wiper arm have not been continuously and consecutively tunable from channel 2 through channel 83. The tuning system 100 shown in FIG. 1 overcomes this deficiency.

Tuning system 100 includes a potentiometer 110 including a continuous resistive element 111 between end points 101 and 104. End points 101 and 104 are connected to terminals 101' and 104', respectively. A power supply 112 develops a voltage V1' corresponds to the beginning of the low VHF band at terminal 101' and a voltage V6' corresponding to the end of the UHF band at terminal 104'. Voltage V1' is slightly less than the tuning voltage magnitude V1 for tuning channel 2. Voltage V6' is slightly greater than the tuning voltage magnitude V6 for tuning channel 83. The voltages V1' and V6' are modified in accordance with an AFT (Automatic Fine Tuning) signal generated by an AFT unit 24 in response to the frequency deviation between the video component of the IF signal and its nominal value, e.g., in the United States 45.75 MHz, to compensate the frequency of the local oscillator signal for environmental conditions and component aging. One circuit for modifying the voltages generated by a power supply such as power supply 112 in response to an AFT signal is disclosed in the aforementioned RCA Service Data.

The tuning voltage for VCLO 18 is developed at a movable wiper contact 116. Movable contact 116 is mechanically linked by means of a shaft 118 to a tuning dial 120. Channel numbers between 2 and 83 are located at angular increments about the periphery of dial 120. As dial 120 is turned, movable contact 116 is synchronously moved along resistive element 111. Thus, points along resistive element 111 correspond to the channel numbers located on dial 120. A pointer 122 indicates the tuning position.

Points 102 and 103 along resistive element 111 between points 101 and 104 define three continuous and consecutive sections 111a, 111b and 111c corresponding proportionately to the low VHF, high VHF and UHF bands. Points 102 and 103 are connected to terminals 102' and 103'. In order that a viewer is able to continuously and consecutively tune receiver 10 through the low VHF, high VHF and UHF bands, voltages V2' and V3' corresponding to the end of the low VHF and the beginning of the high VHF band, respectively, are selectively coupled to terminal 102' and one of voltages V4' and V5' corresponding to the end of and the beginning of the high VHF band and UHF band, respectively, are coupled to terminal 103' in response to the position of movable contact 116. Voltage V2' is developed by a voltage source 124 and is slightly greater than tuning voltage magnitude V2 for tuning channel 6. Voltage V3' is developed by a voltage source 126 and is slightly less than the tuning voltage magnitude for tuning channel 7. Voltage V4' is developed by a voltage source 128 and is slightly greater than the tuning voltage magnitude for tuning channel 13. Voltage V5' is developed by a voltage source 130 and is slightly less than the tuning voltage magnitude for tuning channel 14. Voltage sources 124, 126, 128 and 130 are also responsive to the AFT to account for environmental conditions and component aging.

Voltage switching unit 132 selectively couples one of voltages V2' and V3' to terminal 102' and one of voltages V4' and V5' to terminal 103' in response to bandswitching signals VH and U generated by a switching logic unit 134. The VH and U bandswitching signals as well as the VL band-switching signal, also generated by switching logic unit 134, are coupled to VCLO 18 and RF unit 14 to enable operation of the various tuning arrangements as indicated above. The tuning arrangements of RF unit 14 and VCLO 18 are enabled when the respective bandswitching signal is at a high level. Switching logic unit 134 is responsive to a VL/VH output signal generated by voltage comparator 136 and a V/U output signal generated by a comparator 138. Voltage switching unit 132 and switching logic unit 134 are arranged so that in response to the VL/VH and V/U signals: bandswitching signal Vl is at a high level and voltage V2' is coupled to terminal 102' when movable contact 116 is in section 111a; band-switching signal VH is at a high level and voltage V3' is coupled to terminal 102' and V4' is coupled to terminal 103' when movable contact 116 is in section 111b; and bandswitching signal U is at a high level and voltage V5' is coupled to terminal 103' when movable contact 116 is in section 111c.

Voltage comparator 136 has a noninverting (+) input coupled to movable contact 116 and an inverting (−) input coupled to terminal 102'. The output signal VL/VH of comparator 136 is at a low level when movable contact 116 is in section 111a and the tuning voltage at movable contact 116 is less than the voltage at terminal 102' and at a high level when movable contact 116 is in section 111b or 111c and the tuning voltage at movable contact 116 is equal to or greater than the voltage at terminal 102'. Voltage comparator 138 has a noninverting (+) input coupled to movable contact 116 and an inverting (−) input coupled to terminal 103'.

The output signal V/U of comparator 138 is at a low level when movable contact 116 is in sections 111a or 111b and the tuning voltage at movable contact 116 is less than the voltage at terminal 103' and at a high level when movable contact 116 is in section 111c and the tuning voltage at movable contact 116 is equal to or greater than the voltage at terminal 103'. Since comparators 136 and 138 are directly coupled to terminals 102' and 103', separate reference voltage sources for the comparisons, typically requiring adjustments to match the voltages at points 102 and 103, are avoided.

Figure 3:
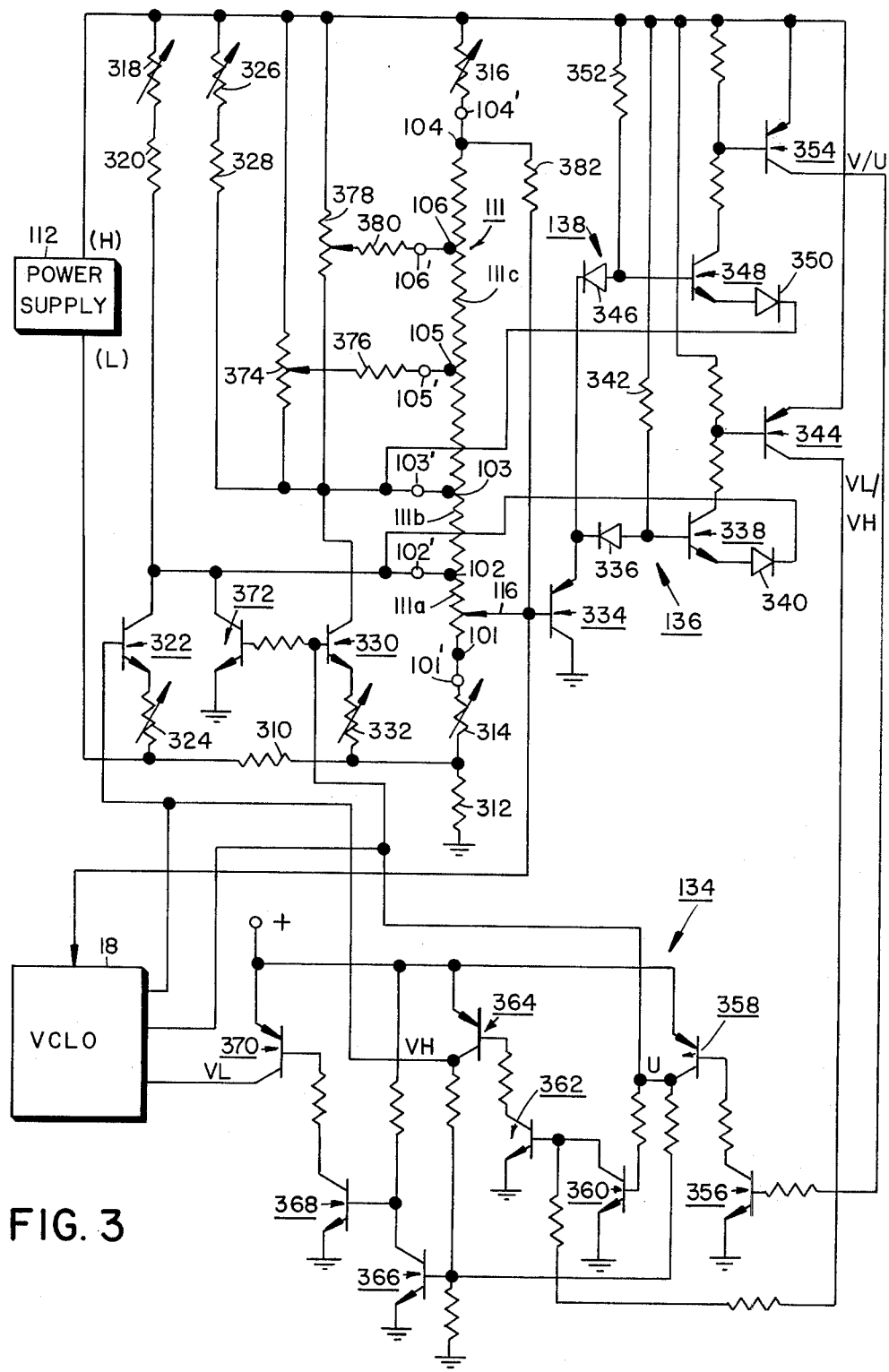
FIG. 3 shows in schematic diagram form an embodiment of the electrical portion of the tuning system shown in FIG. 1.

In the circuit implementation of tuning system 100 shown in FIG. 3, a first positive voltage developed at a first output (L) of power supply 112 is coupled to terminal 101' through a resistor divider network including fixed resistors 310 and 312 and variable resistor 314. Variable resistor 314 is adjusted to develop voltage V1' at point 101. A second positive voltage, higher in magnitude than the first, developed at a second output (H) of power supply 112 is coupled to terminal 104' through a variable resistor 316. Variable resistor 316 is adjusted to develop voltage V6' at point 104. The switching arrangement for selectively developing one of voltages V2' or V3' at point 102 includes a voltage divider comprising a variable resistor 318, a fixed resistor 320, an NPN transistor 322 and a variable resistor 324 coupled between the outputs of power supply 112. The junction of resistor 320 and transistor 322 is coupled to terminal 102'. When transistor 322 is non-conductive, the voltage at point 102 is determined by variable resistor 318 and fixed resistor 320. Under these conditions, variable resistor 318 is adjusted to develop voltage V2' at point 102. When transistor 322 is conductive, the voltage at point 102 is determined by variable resistor 318, fixed resistor 320 and variable resistor 324. Under these conditions, variable resistor 324 is adjusted to develop voltage V3' at point 102.

The switching arrangement for selectively developing one of voltages V4' or V5' at point 103 includes a voltage divider comprising a variable resistor 326, a fixed resistor 328, an NPN transistor 330 and a variable resistor 332 coupled between the outputs of power supply 112. The junction of resistor 328 and transistor 330 is coupled to terminal 103'. When transistor 330 is non-conductive, the voltage at point 103 is determined by variable resistor 326 and fixed resistor 328. Under these conditions, variable resistor 326 is adjusted to develop voltage V4' at point 103. When transistor 330 is conductive, the voltage at point 103 is determined by variable resistor 326, fixed resistor 328 and variable resistor 332. Under these conditions, variable resistor 332 is adjusted to develop voltage V5' at point 103.

Voltage comparator 136 comprises a first current path including the base-emitter junction of a PNP transistor 334 arranged as an emitter-follower and a diode 336 and a second current path including the base-emitter junction of an NPN transistor 338 and a diode 340. The base of transistor 334 is coupled to movable contact 116. The cathode of diode 340 is coupled to terminal 102'. A resistor 342 is coupled between power supply 112 and the junction of diode 336 and the base of transistor 338. With the base-to-emitter junctions of transistors 334 and 338 and diodes 336 and 340 poled as shown and assuming that the emitter-to-base junction of transistor 334 and the base-to-emitter junction of transistor 338 have similar conduction characteristics and that diode 336 and diode 340 have similar conduction characteristics, current will flow: primarily through the first current path when the voltage at movable contact 116 is less than the voltage at terminal 102'; substantially in equal amounts through the first and second current paths when the voltage at movable contact 116 is substantially equal to the voltage at terminal 102'; and primarily through the second current path when the voltage at movable contact 116 is greater than the voltage at terminal 102'. As a result, transistor 338 is nonconductive when the voltage at movable contact 116 is less than the voltage at terminal 102' and conductive when the voltage at movable contact 116 is substantially equal to or greater than the voltage at terminal 102'. Although diodes 336 and 340 are not strictly necessary, they are desirable to protect transistors in situations where it is expected that the difference between the voltages at movable contact 116 and terminal 102' will approximate the maximum permissible base-to-emitter reverse voltage rating of transistors 334 and 338.

The signal VL/VH is generated at the collector of a transistor 344 having its base coupled to the collector of transistor 338 and its emitter coupled to power supply 112. Transistor 344 is nonconductive and VL/VH is at a low level when transistor 338 is nonconductive. Transistor 344 is conductive and VL/VH is at a high level when transistor 338 is conductive.

Comparator 138 shares transistor 334 with comparator 136 and further includes diode 346, NPN transistor 348, diode 350, resistor 352 and PNP transistor 354 and is arranged in a similar manner to comparator 136. Accordingly, transistor 354 is nonconductive and output signal V/U is at a low level when the voltage at movable contact 116 is less than the voltage at terminal 103' and transistor 354 is conductive and output signal V/U is at a high level when the voltage at movable contact 116 is substantially equal to or greater than the voltage at terminal 103'.

Assuming for the present that movable contact 116 is moved from the bottom end of resistive element 111 at point 101 to the top end of resistive element 111, the voltage at movable contact 116 will always be less than the voltage at the next one of points 102 and 103 to be reached and greater than the voltage at the last one of points 102 and 103 to be traversed. Under these conditions, the following table is applicable to signals VL/VH and V/U:

| | POSITION OF CONTACTING | | |
|---|---|---|---|
| Signal | 111a | 111b | 111c |
| VL/VH | L | H | H |
| V/U | L | L | H | where L indicates the low level of VL/VH and V/U and H indicates the high level of VL/VH and V/U. It is noted that both VL/VH and V/U are at their high levels when movable contact 116 is in section 111c. In other words, the state that VL/VH is at its low level and V/U is at its high level does not occur.

Switching logic unit 134 includes an arrangement of transistors 356–370 which in response to signals VL/VH and V/U control the conduction states of transistors 322 and 330. The following truth table indicates the operation of switching logic unit 134 in response to signals VL/VH and V/U.

| Transistor | VL/VH = L<br>V/U = L | VL/VH = H<br>V/U = L | VL/VH = H<br>V/U = H |
| --- | --- | --- | --- |
| 356 | N | N | C |
| 358 | N | N | C |
| 360 | N | N | C |
| 362 | N | C | N |
| 364 | N | C | N |
| 366 | N | C | C |
| 368 | C | N | N |
| 370 | C | N | N |
| 322 | N | C | N |
| 330 | N | N | C |

N indicates a nonconductive state of a transistor and C indicates the conductive state of the transistor. In summary: neither transistor 322 nor 330 is conductive when movable contact 116 is in section 111a; transistor 322 is conductive and transistor 330 is nonconductive when movable contact 116 is in section 111b; and transistor 330 is conductive and transistor 322 is nonconductive when movable contact 116 is in section 111c.

Bandswitching voltages VL, VH and U for RF unit 14 and VCLO 18 are generated at the collectors of PNP transistors 370, 364 and 358, respectively. Accordingly, VL, VH and U are at their high levels when transistors 370, 364 and 358, respectively, are conductive and are at their lower levels when transistors 370, 364 and 358, respectively, are nonconductive.

For the proper control of the conduction states of transistors 322 and 330 when movable contact 116 is moved in a direction from point 101 to point 104, it is necessary with the implementation shown in FIG. 3 that the voltage at movable contact 116 be less than the voltage at the next one of points 102 and 103 to be reached and is greater than the voltage at the last one of points 102 and 103 traversed. With the tuning voltage characteristics shown in FIG. 2, this condition is satisfied.

For the proper control of the conduction states of transistors 322 and 330 when movable contact 116 is moved in a direction from point 104 to point 101, it is necessary with the implementation shown in FIG. 3 that the voltage at movable contact 116 be greater than the voltage at the next one of points 102 and 103 to be reached and less than the voltage at the last one of points 102 and 103 traversed. With the tuning voltage characteristics shown in FIG. 2, the latter condition would not be satisfied (in the absence of transistor 372) when movable contact 116 is moved in the direction from point 104 to point 101 and traverses point 103. This is so (in the absence of transistor 372) because when movable contact 116 is in section 111c, the voltage, V5', at point 103 will be less than the voltage, V2', at point 102. Thus, as movable contact 116 moves along section 111b from point 103 to point 102, the voltage at movable contact 116 would not become less than the voltage at point 103.

NPN transistor 372 having its collector-to-emitter junction coupled between the terminal 102' and ground and its base coupled to the collector of transistor 358 remedies this situation. When movable contact 116 is in section 111c and transistor 358 is accordingly conductive, transistor 372 is conductive. As a result, the voltage at point 102 is caused to be lower than the voltage at point 103. Thus, when movable contact 116 is moved in the direction from point 104 to point 101 and traverses point 103, the voltage at movable contact 116 will be less than the voltage at point 103 and the necessary conditions for proper control of transistors 322 and 330 are satisfied.

Comparators 136 and 138 are constructed to have outputs at a high level when the voltages at their respective inputs have equal magnitudes. If other comparators having outputs the levels of which are not defined when the magnitudes of the input voltages are equal are utilized, it is desirable that such comparators have provisions by which the inputs may be intentionally offset with respect to each other so that the levels of the outputs are defined when the inputs are equal.

As is indicated in FIG. 2, the tuning voltage characteristics are nonlinear functions of frequency. In addition, in the United States spacing between channels 4 and 5 is 10 MHz while the channel spacing between other adjacent channels in the same band is 6 MHz. As a result, the channel numbers on dial 120 cannot be located at equal angular increments from one another unless the tuning voltage is made a nonlinear function of the position of movable contact 116 along resistive element 111 to compensate for the nonlinear tuning voltage characteristics indicated in FIG. 3. To accomplish this for channels in the UHF band, potentiometers 374 and 378 are coupled between the relatively positive output (H) of power supply 112 and terminal 103'. The wiper contact of potentiometer 374 is coupled through a fixed resistor 376 to a terminal 105' connected to a point 105 along section 111c. The wiper of potentiometer 378 is coupled through a fixed resistor 380 to a terminal 106' connected to a point 106 along section 111c. Points 105 and 106 correspond to channels, e.g., channels 45 and 60, in the most nonlinear region of the tuning voltage characteristic for the UHF band.

The nonlinear tuning voltage characteristics of the low and high VHF bands may be compensated in a manner similar to the manner in which the nonlinear tuning voltage characteristic of the UHF band is compensated. However, other means such as illustrated in the mechanical implementation of potentiometer 110 shown in FIG. 4 may also be employed.

The mechanical implementation of potentiometer 110 of FIGS. 1 and 3 includes a substrate of a dielectric material such as a ceramic upon which is formed a resistive film 412 which serves as resistive element 111. Resistive film 412 may be a carbon based ink which is printed on substrate 410. Resistive film 412 follows a circular path. Terminals 101' through 106' are metal conductors formed on substrate 410 by printed circuit techniques prior to the formation of resistive film 412 so as to be partially covered and thereby in contact with it. An arm 414 is mechanically coupled to dial 120 (not shown in FIG. 4) by shaft 118 positioned at the center of the circular path of resistive film 414. A metal conductor 416 is also formed on dielectric substrate 410 by printed circuit methods. Conductor 416 follows another circular path which is concentric with the circular path of resistive film 412. Movable contact 116 is bifurcated and located on arm 414 so that one leg contacts resistive film 412 and the other leg contacts conductor 416. Conductor 416 serves as a commutator ring and the tuning voltage developed at movable contact 116 is coupled from a connection point 417 to RF unit 14 and VCLO 18. The conductors associated with terminals 101', 102', 103' and 104' substantially underlay the radial length of resistive film 412 at points 101, 102, 103 and 104, respectively, so that there is substantially no voltage drop between movable contact 116 and at the voltages developed at terminals 101', 102', 103' and 104' when it is at point 101, 102, 103 and 104, respectively. This enables voltages V1', V2', V3' and V4' developed at points 101, 102, 103 and 104, respectively, to be more accurately controlled by means of their respective adjustment arrangements as shown in FIG. 3 and also enables comparators 134 and 136 to more accurately determine when movable contact 116 has reached points 102 and 103.

Sections 111a and 111b are shaped to have resistances which increase nonlinearly as a function of angular distance from their beginning points 101 and 102 to compensate for the nonlinear tuning voltage characteristics of the low VHF and high VHF bands, respectively. The nonlinearity of the tuning voltage characteristic of the UHF band is compensated by use of terminals 105' and 106' as described above. Accordingly, points along potentiometer 110 of FIG. 4 corresponding to adjacent channels are separated at substantially equal angular increments and the arcuate lengths of sections 111a, 111b and 111c are directly proportional to the number of channels in the low VHF, high VHF and UHF bands. As a result, dial 120 may have channel numbers separated at equal angular increments.

Since resistive film 412 has a circular path, tuning system 100 will be able to be tuned from channel 83 to channel 2 without changing the direction of motion of arm 414. Since the voltages at terminals 101' and 104' are not switched, a small gap exists in resistive film between points 101 and 104. The arcuate length of the gap is greater than the arcuate length of the output surface of contact 116 along the circular path of resistive film 412, but less than the arcuate length between points corresponding to adjacent channels. To prevent a loss of tuning voltage when movable contact 116 is in the gap between points 104 and 101, the tuning voltage will have a magnitude corresponding at least approximately to channel 83. Resistor 382 may alternately be coupled between movable contact 116 and terminal 101'. In this case, when movable contact 116 is in the gap between points 104 and 101, the tuning voltage will have a magnitude corresponding at least approximately to channel 2. Desirably, the resistance of resistor 382 should in either case be relatively high (e.g., 10 megohms) compared with the resistance of resistive element 111 (e.g., 300 kilohms).

If it were desired to make resistive film 412 without a gap, this could be accomplished by placing a terminal at the present location of the gap and providing means to selectively develop voltage V1' at the terminal when contact 116 is in section 111a and develop voltage V6' at the terminal when contact 116 is in section 111c.

Figure 5:
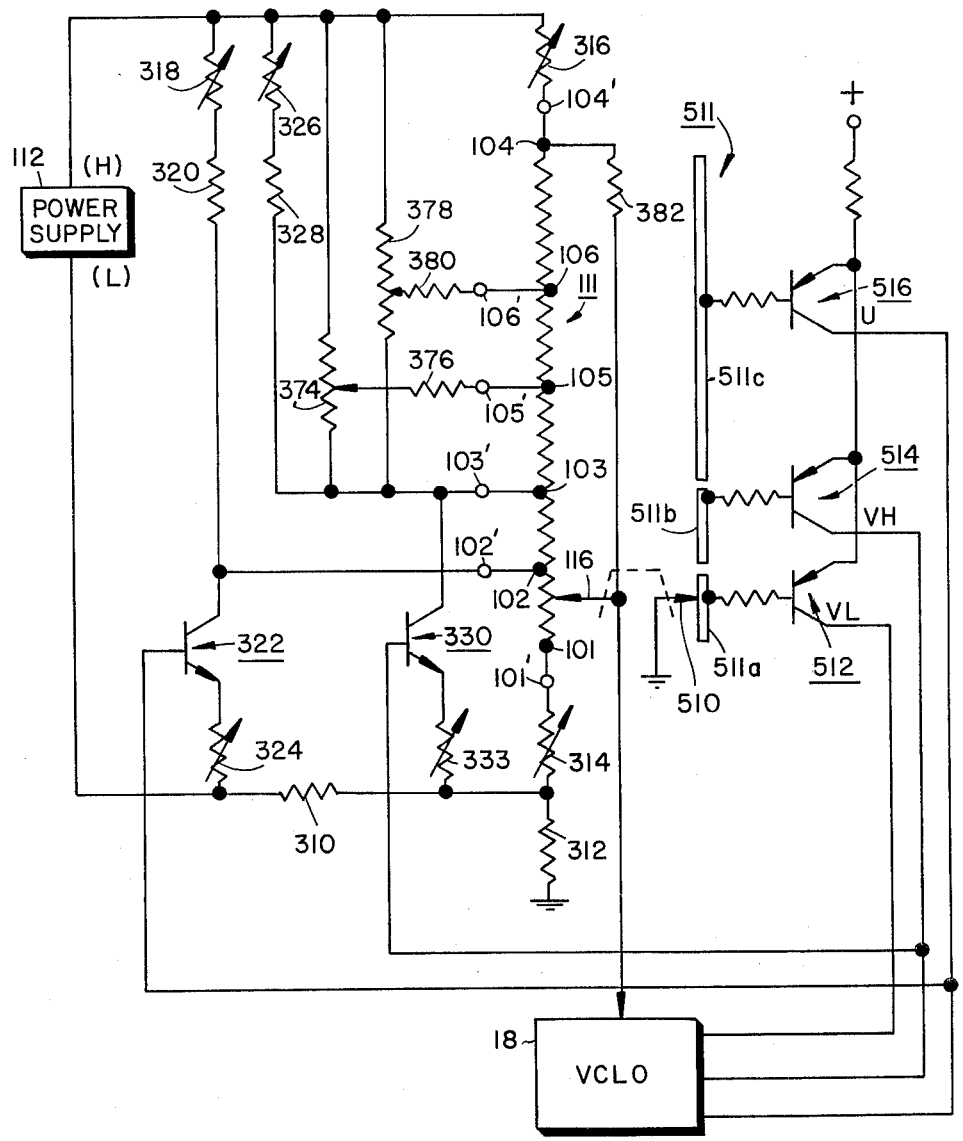
FIG. 5 shows in schematic diagram form an embodiment of the electrical portion of another tuning system constructed in accordance with the present invention.

FIG. 5 illustrates another implementation of a tuning system constructed in accordance with the present invention. The chief difference between the implementation shown in FIG. 3 and that shown in FIG. 5 is that the signals for controlling the conductivity of transistors 322 and 330 and for deriving the bandswitching voltages VL, VH and U are derived by mechanical means. Specifically, this is accomplished by providing a second movable contact 510 which is mechanically linked with wiper 116 to move synchronously with it along a contact 511 segmented into sections 511a, 511b and 511c corresponding to sections 111a, 111b and 111c of resistive element 111. Movable contact 510 is coupled to signal ground. Contact sections 511a, 511b and 511c are respectively coupled to the bases of PNP transistors 512, 514 and 516. PNP transistors 512, 514 and 516 correspond to transistors 370, 364 and 358, respectively, of the implementation shown in FIG. 3. As a result, as movable contact 510 moves from one of contact segments 511a, 511b or 511c to another, respective transistors 512, 514 and 516 are rendered conductive, thereby controlling the conduction of transistors 322 and 330 and the generation of bandswitching voltages VL, VH and U in the same manner as switching logic unit 134 of FIG. 3. Although the implementation shown in FIG. 5 is mechanical in nature, it has the advantage of using substantially less transistors for voltage switching than the implementation shown in FIG. 3.

Figures 4, 6:
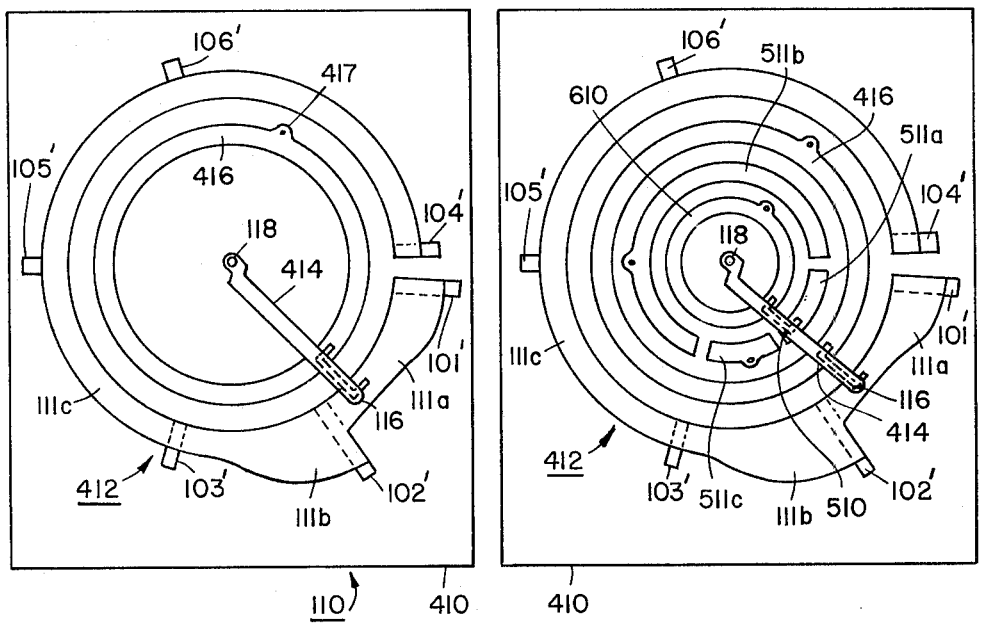
FIG. 4 shows in a plan view an embodiment of the mechanical portion of the tuning system of FIG. 1.
FIG. 6 shows in a plan view an embodiment of the mechanical portion of the tuning system shown in FIG. 5.

As shown in FIG. 6, a mechanical implementation of potentiometer 110 of the arrangement shown in FIG. 5 includes the basic arrangement of potentiometer 110 shown in FIG. 4 and additional elements associated with movable contact 510. Specifically, contact sections 511a, 511b and 511c are formed in angular alignment with resistive sections 111a, 111b and 111c, respectively, along a third circular path which is concentric with the two circular paths of resistive film 412 and commutator conductor 416. A second commutator conductor 610 is formed along a fourth circular path concentric with the others. Commutator conductor 610 is coupled to signal ground. Movable contact 510 is bifurcated and positioned on arm 414 to couple signal ground from commutator conductor 610 to conductor segments 511a, 511b and 511c as movable contact 116 is moved along resistive path 412. The angular distance between conductor sections 511a, 511b and 511c is greater than the surface area with which contact 510 contacts sections 511a, 511b and 511c, but is smaller than the angular distance between points corresponding to adjacent channels.

Because the tuning voltage generated by the present tuning system is continuously adjustable, it is possible to eliminate AFT discriminator 24. However, AFT discriminator 24, in addition to modifying the tuning voltage to compensate for changes in environmental conditions and the like, increases the effective portions of resistive element 111 corresponding to channels. That is, even if movable contact 116 is not precisely at the point of resistive element 111 corresponding to the channel to be tuned, AFT discriminator 24 will tend to adjust the tuning voltage to the correct magnitude. As a result, the sensitivity of the angular position of dial 120 is reduced. Nevertheless, the angular position of dial 120 is relatively accurately related to the channel being tuned. This is so because the angular position of band transistors are determined by the location of taps 102' and 103' relative to terminals 101' and 104', all of which can be accurately located consistently in the manufacturing process. Thus, the band transitions are not determined by the linearity or absolute resistance of resistive element 111 which tends to be more difficult to control.

Thus, what has been described are tuning systems in which a tuning voltage is derived at the wiper arm of a potentiometer which is continuously and consecutively tunable throughout the television range. Since it does not have mechanical detents, it is rapidly tunable from any channel to any other, including tuning from UHF channels to VHF channels without changing tuning direction. In addition, fine tuning is simplified since a user tends to tune through the tuning range associated with each channel from beginning to end.

What is claimed is:

1. A tuning system for tuning a receiver to various channels in at least a first and a second tuning band, comprising:
   a frequency tunable circuit;
   voltage variable means for determining the frequency response of said tunable circuit in response to a tuning voltage, said tuning voltage having first, second, third and fourth magnitudes corresponding to the lowest frequency channel in said first band, the highest frequency channel in said first band, the lowest frequency channel in said second band and the highest frequency channel in said second band, respectively;
   a continuous resistive element having first, second and third points defining first and second consecutive and continuous sections corresponding to said first and second tuning bands, respectively;
   a movable contact;
   means for moving said movable contact along said resistive element;
   position detecting means for determining when said movable contact is in said first and second sections of said resistive element; and
   voltage coupling means responsive to said position detecting means for selectively coupling voltages to said resistive element to develop first and second voltages corresponding to said first and second magnitudes of said tuning voltage at said first and second points, respectively, when said movable contact is in said first section of said resistive element and to develop third and fourth voltages corresponding to said third and fourth magnitudes of said tuning voltage at said second and third points, respectively, when said movable contact is in said second section;
   said tuning voltage being developed at said movable contact.

2. The apparatus recited in claim 1 wherein:
   said voltage coupling means includes first, second and third terminals coupled to said first, second and third points of said resistive element; first means for developing said first voltage at said first terminal; second means for selectively developing said second voltage at said second terminal when said movable contact is in said first section and said third voltage at said second terminal when said movable contact is in said second section; and third means for developing said fourth voltage at said third terminal.

3. The apparatus recited in claim 2 wherein:
   said position detecting means includes comparator means having a first input coupled to said movable contact, a second input coupled to said second terminal, and an output coupled to said second coupling means, said comparator means developing an output having a first level when the magnitude of the voltage developed at said movable contact is less than the magnitude of the voltage developed at said second terminal and a second level when the magnitude of the voltage developed at said movable contact is substantially equal to or greater than the magnitude of the voltage developed at said second terminal;
   said second means developing said second voltage at said second terminal in response to said first level and developing said third voltage at said second terminal in response to said second level.

4. The apparatus recited in claim 2 wherein:
   said first, second, third and fourth magnitudes of said tuning voltage correspond to the lowest frequency channel in a low VHF television band, the highest frequency channel in said low VHF television band, the lowest frequency in a high VHF television band, and the highest frequency in said high VHF television band, respectively, and fifth and sixth magnitudes of said tuning voltage correspond to the lowest frequency channel in a UHF band and the highest frequency in said UHF band;
   said resistive element includes a fourth point which together with said third point defines a third section of said resistive element which is consecutive and continuous with respect to said second section, said first, second and third sections of said resistive element corresponding to said low VHF, high VHF and UHF bands, respectively;
   said voltage coupling means includes a fourth terminal coupled respectively to said fourth point; said third means selectively developing said fourth voltage at said third terminal when said movable contact is in said second section and developing a fifth voltage corresponding to said fifth magnitude at said third terminal when said movable contact is in said third section; and sixth means for developing a sixth voltage corresponding to said sixth magnitude at said sixth terminal.

5. A tuning system for tuning a receiver to various channels, comprising:
   a frequency tunable circuit;
   voltage variable means for determining the frequency response of said tunable circuit in response to the magnitude of a tuning voltage;
   a resistive element, points along said resistive element corresponding to respective channels;
   a movable contact;
   means for moving said movable contact along said resistive element;
   means for coupling voltages to said resistive element to develop said tuning voltage at said movable contact;
   comparator means coupled to said movable contact and one of said points along said resistive element for generating a control signal in response to the relationship between said tuning voltage and the voltage developed at said one point; and
   utilization means for determining a predetermined operating condition of said receiver in response to said control signal.

6. The apparatus recited in claim 5 wherein:
   said voltage variable means includes at least first and second means selectively enabled in response to said control signal for determining the frequency response of said tunable circuit in at least two respective tuning bands.

7. The apparatus recited in claim 6 wherein:
   first, second and third points along said resistive element define first and second sections corresponding to said first and second bands, respectively;
   said comparator means is responsive to the voltage developed at said second point, said control voltage having a first level when the magnitude of said tuning voltage is less than the magnitude of the voltage developed at said second point and a second level when the magnitude of said tuning voltage is greater than the magnitude of the voltage developed at said second point;

said first means being enabled in response to said first level of said control signal and second means being enabled in response to said second level of said control signal; and said means for coupling voltages to said resistive element is responsive to said control signal to selectively couple voltages to said resistive element to selectively develop a first voltage having a magnitude corresponding to a magnitude of said tuning voltage associated with the lowest frequency channel in said first band at said first point and a second voltage having a magnitude corresponding to a magnitude of said tuning voltage associated with the highest frequency channel in said first band at said second point in response to the first level of said tuning voltage and a third voltage having a magnitude corresponding to a magnitude of said tuning voltage corresponding to the lowest frequency channel in said second band at said second point and a fourth voltage having a magnitude corresponding to a magnitude of said tuning voltage associated with the highest frequency channel in said second band at said third point in response to said second level of said control signal.

8. In a system for tuning a receiver to all the channels in at least first and second bands, apparatus comprising:
a voltage variable tuning element;
a continuous resistive element;
a movable contact;
means for moving said contact along said resistive element;
means for selectively coupling different voltages to said resistive element in response to the position of said movable contact along said resistive element so that a tuning voltage for tuning said tunable element to all of said channels in said first and second bands is generated at said movable contact as it is continuously and consecutively moved along said resistive element.

* * * * *